United States Patent
Giesselmann et al.

(10) Patent No.: US 12,338,121 B2
(45) Date of Patent: Jun. 24, 2025

(54) ELECTROMECHANICAL SYSTEM AND METHOD FOR OPERATING AN ELECTROMECHANICAL SYSTEM

(71) Applicant: Robert Bosch GmbH, Stuttgart (DE)

(72) Inventors: Timo Giesselmann, Stuttgart (DE); Gerhard Lammel, Tuebingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 8 days.

(21) Appl. No.: 18/548,266

(22) PCT Filed: Jul. 6, 2022

(86) PCT No.: PCT/EP2022/068684
§ 371 (c)(1),
(2) Date: Aug. 29, 2023

(87) PCT Pub. No.: WO2023/285225
PCT Pub. Date: Jan. 19, 2023

(65) Prior Publication Data
US 2024/0140784 A1 May 2, 2024

(30) Foreign Application Priority Data
Jul. 16, 2021 (DE) .................. 10 2021 207 591.6

(51) Int. Cl.
*B81B 7/00* (2006.01)
*G01C 19/5776* (2012.01)

(52) U.S. Cl.
CPC .......... *B81B 7/008* (2013.01); *G01C 19/5776* (2013.01)

(58) Field of Classification Search
CPC .................. B81B 7/008; G01C 19/5776
See application file for complete search history.

(56) References Cited

U.S. PATENT DOCUMENTS

| | | | |
|---|---|---|---|
| 2011/0285445 A1* | 11/2011 | Huang | H03B 5/30 318/116 |
| 2012/0086367 A1* | 4/2012 | Iyad Al Dibs | H02N 1/006 318/116 |
| 2016/0241146 A1 | 8/2016 | Oliaei | |

FOREIGN PATENT DOCUMENTS

| | | |
|---|---|---|
| DE | 102012208036 A1 | 11/2013 |
| DE | 102016203044 A1 | 8/2017 |
| EP | 2479362 A1 | 7/2012 |

OTHER PUBLICATIONS

International Search Report for PCT/EP2022/068684, Issued Oct. 31, 2022.

(Continued)

*Primary Examiner* — Zoheb S Imtiaz
(74) *Attorney, Agent, or Firm* — NORTON ROSE FULBRIGHT US LLP

(57) ABSTRACT

An electromechanical system. The electromechanical system includes: a microelectromechanical (MEMS) apparatus which has a component which can oscillate; a signal processing apparatus which is designed to receive and process a signal output by the MEMS apparatus; a voltage provision apparatus which is designed to provide at least one supply voltage for the signal processing apparatus, wherein the voltage provision apparatus includes at least one switching regulator. The voltage provision apparatus can be operated in a synchronous operating state and in an asynchronous operating state.

10 Claims, 2 Drawing Sheets

(56) References Cited

OTHER PUBLICATIONS

Akram et al., "Architectural Advancement of Digital Low Dropout Regulators," IEEE Access, IEEE, vol. 8, 2020, pp. 137838-137855. <https://ieeexplore.ieee.org/stamp/stamp.jsp?tp=&arnumber=9151123> Aug. 25, 2023.

* cited by examiner

ELECTROMECHANICAL SYSTEM AND METHOD FOR OPERATING AN ELECTROMECHANICAL SYSTEM

FIELD

The present invention relates to an electromechanical system and a method for operating an electromechanical system.

BACKGROUND INFORMATION

Microelectromechanical systems (MEMS) can comprise rotation rate sensors or oscillating micromirrors, for example. These typically consist of a MEMS element having a mechanically oscillating mass (a MEMS oscillator) and an application-specific integrated circuit (ASIC). The ASIC is used to control the MEMS oscillator and also for evaluating and preparing and, if necessary, processing the electrical signals.

In the power supply of these ASICs, voltage regulators are used which down-regulate the external supply voltage from, for example, 3.3 volts to at least one lower voltage, for example a voltage of less than one volt, which is or are suitable for supplying power to the internal circuit parts on the ASIC. This voltage is referred to as "core voltage". The low core voltages are required due to the ASIC technologies used. The voltage regulators are preferably implemented on the ASIC.

Linear regulators are used as voltage regulators, in particular LDO (low drop-out) regulators, which are characterized by cost-effective implementation and high interference suppression. However, linear regulators have a high power dissipation and thereby lead to a high total power consumption of the system. For example, at the input and core voltages mentioned above, approximately 70% of the power would be consumed by the linear regulator, while only 30% of the power can be used to operate the circuit. The power consumption is therefore higher, by a factor of 3.3, than is theoretically necessary.

As an alternative to linear regulators, switching regulators ("DC-DC") could be used. This could improve the efficiency of the regulator and thus the power consumption of the sensor system. However, in contrast to linear regulators, switching regulators are operated at an oscillating frequency which results in a residual ripple in the output voltage. This interfering signal can cause interferences in the measuring or control arrangement of the system, for example, and thus leads to degradation of performance in the form of noise and potential superpositioning of mixed products from the frequency of the switching regulator and the frequency of the MEMS oscillator, in particular of the rotation rate sensor or micromirror for example. This is one of the main reasons why switching regulators currently are not used for generating the core voltage in MEMS systems.

SUMMARY

The present invention provides an electromechanical system and a method for operating an electromechanical system.

Preferred embodiments of the present invention are disclosed herein.

According to a first aspect, the present invention relates to an electromechanical system having a microelectromechanical (MEMS) apparatus which has a component which can oscillate, wherein the MEMS apparatus is designed to output a signal which is dependent on an oscillating movement of the oscillation-capable component.

The electromechanical system further comprises a signal processing apparatus designed to receive and process the signal output by the MEMS apparatus. Further, the electromechanical system comprises a voltage provision apparatus designed to provide at least one supply voltage for the signal processing apparatus, the voltage provision apparatus comprising at least one switching regulator. According to an example embodiment of the present invention, the voltage provision apparatus may be operated in a synchronous operating state and in an asynchronous operating state. The voltage provision apparatus is operable in the synchronous operating state when the oscillation-capable component is excited to oscillations, wherein the voltage provision apparatus is operated as a switching regulator in the synchronous operating state, and wherein in the synchronous operating state the switching regulator is synchronized with the oscillating movement of the oscillation-capable component. In the asynchronous operating state, the voltage provision apparatus is not synchronized with the oscillation-capable component.

According to a second aspect, the present invention relates to a method of operating an electromechanical system having a microelectromechanical (MEMS) apparatus which has a component which can oscillate, wherein the MEMS apparatus is designed to output a signal which is dependent on an oscillating movement of the oscillation-capable component, a signal processing apparatus which is designed to receive and process the signal output by the MEMS apparatus, and a voltage provision apparatus which is designed to provide a supply voltage for the signal processing apparatus. According to an example embodiment of the present invention, the voltage provision apparatus may be operated in an asynchronous operating state, wherein in the asynchronous operating state the voltage provision apparatus is not synchronized with the oscillation-capable component. The voltage provision apparatus may operate in a synchronous operating state when the oscillation-capable component is excited to oscillations, wherein the voltage provision apparatus operates as a switching regulator in the synchronous operating state, and wherein in the synchronous operating state the switching regulator is synchronized with the oscillating movement of the oscillation-capable component.

The present invention makes it possible, by using at least one switching regulator, to lower the power consumption of the electromechanical system without generating interference due to the superpositioning of asynchronous oscillating frequencies of the MEMS oscillator and the switching regulator.

In so doing, the switching regulator or regulators can be operated in two modes (operating states), namely asynchronous and synchronous modes. In the asynchronous operating state, the switching regulator oscillates at its own, preferably self-generated frequency.

In the synchronous mode, the switching regulator may be synchronized with the oscillation of the oscillation-capable component (MEMS oscillator).

The oscillation-capable component typically does not always oscillate, for example when it is turned on or when the oscillator is not being operated, so as to conserve power. In this case, the voltage provision apparatus may be operated in the asynchronous operating state so as to ensure the availability of the core voltage.

According to a further embodiment of the electromechanical system of the present invention, the voltage provision apparatus is operated in the asynchronous operating state if the oscillation-capable component is not active, i.e., does not execute any oscillating movement or is not yet oscillating stably, i.e., is not yet in its steady oscillating state. In these situations, interferences from the switching regulator acting on the system (for example a sensor system) are not usually disruptive.

An advantage of the present invention is that the synchronous operating mode provides a way to use switching regulators without the residual ripple of the switching regulator affecting system performance.

According to a further embodiment of the electromechanical system of the present invention, the voltage provision apparatus is part of the MEMS apparatus. The voltage provision apparatus may be arranged on a common substrate of the MEMS apparatus and/or located in a housing of the MEMS apparatus.

According to a further embodiment of the present invention, the entire electromechanical system itself is a microelectromechanical (MEMS) system. In this case, the voltage provision apparatus is part of the MEMS system.

According to another embodiment of the present invention, the electromechanical system is a macrosystem (i.e., not a MEMS system). For example, the electromechanical system may be a smartphone, tablet, wearable, bearable, augmented reality device, virtual reality device, a drone, a gaming device, a toy, a robot, a personal digital assistant, a smart home device, or a device in an industrial context, or may also be a component of one of these devices. In particular, the electromechanical system may be used for at least one of the following applications: Detection of significant movement, freefall detection, context detection, gesture control, height stabilization, building floor detection, flight controls, elderly care, calorie counters, navigation inside and outside of buildings, position tracking, border and obstacle detection; detection of mounted headsets/earpieces (hearables) as in-ear detection, determination of head orientation and head movement. MEMS apparatuses are used in various computer-controlled devices, such as robots, domestic appliances, production facilities, access control systems, vehicles (for example autonomous vehicles), and also for active and passive safety, e.g., for ESP, roll-over sensing, etc., as well as in driver assistance systems, wherein the electromechanical system may be one of these devices or a component of these devices.

According to an example embodiment of the present invention, the voltage provision apparatus can be part of the MEMS apparatus. However, the voltage provision apparatus may also be designed external to the MEMS apparatus. In particular, an external switching regulator may be provided as part of the voltage provision apparatus.

According to a further embodiment of the electromechanical system of the present invention, the signal, which is dependent on the oscillating movement of the oscillation-capable component, is a measurement signal for monitoring the oscillating movement of the MEMS oscillator, forming the basis for regulating the oscillating movement. For example, the signal may include information relating to a deflection or the position of the oscillation-capable component and/or the oscillating frequency and/or the phase of the oscillating movement of the oscillation-capable component.

According to a further embodiment of the electromechanical system of the present invention, although the voltage provision apparatus may be operated in the synchronous operating state, when the oscillation-capable component is excited to oscillations it may nevertheless also continue to be operated at least temporarily in the asynchronous mode.

The operating state in which the voltage provision apparatus is operating may depend on external conditions, e.g., it may depend on the steady oscillating state of the MEMS oscillator or also on application-related performance requirements for the MEMS system. For example, an additional signal may be used to control whether the voltage provision apparatus is operating in the synchronous operating state when the oscillation-capable component is excited to oscillations.

According to another embodiment of the electromechanical system of the present invention, the signal processing apparatus is designed to ascertain that the oscillation-capable component is in a steady oscillating state and to switch the voltage provision apparatus to the synchronous operating state when the oscillation-capable component is in the steady oscillating state. In this way, the synchronous operating state may be utilized when the oscillation-capable component oscillates stably. In this case, in order to achieve good performance, it is important to prevent the switching regulator frequency from interfering with electrical signal processing.

According to a further embodiment of the electromechanical system of the present invention, the voltage provision apparatus is designed to switch from the asynchronous operating state to the synchronous operating state upon activation of the MEMS apparatus and/or from the synchronous operating state to the asynchronous operating state upon deactivation of the MEMS apparatus.

According to a further embodiment of the electromechanical system of the present invention, the voltage provision apparatus is designed to switch from the asynchronous operating state to the synchronous operating state after a predetermined time. In particular, the predetermined time may be selected such that after this time, the oscillation-capable component is typically in a steady oscillating state.

According to a further embodiment of the electromechanical system of the present invention, the voltage provision apparatus is operated in the asynchronous operating state as a switching regulator.

According to a further embodiment of the electromechanical system of the present invention, the voltage provision apparatus is operated in the asynchronous operating state as a linear regulator. For example, the linear regulator may be a low-dropout regulator, LDO.

According to a further embodiment of the electromechanical system of the present invention, switching can be done between a linear regulator and a synchronous DC-DC regulator. The voltage regulator may be designed to function as both a linear regulator and a DC-DC regulator. Instead of asynchronous mode, the regulator operates as a linear regulator. For this purpose, the switching transistor of the DC-DC regulator may be used as the power transistor of the linear regulator.

According to a further embodiment of the electromechanical system of the present invention, the switching regulator may be designed as a switch cap instead of an L-C variant.

According to another embodiment of the present invention, the electromechanical system comprises a phase locked loop (PLL). The oscillation-capable element typically oscillates at a few tens of a kHz. This frequency is multiplied, using the phase locked loop, to a cycle suitable for driving signal processing, the cycle being in the MHz range and being used as the system frequency. Advantageously, the frequency for the switching regulator may be derived from the system frequency directly or through an integer divider.

Alternatively, an oscillator in the switching regulator may be controlled by its own phase locked loop, the phase input of which is supplied by a system frequency divider.

In a further embodiment of the present invention, an oscillator, for example an RC oscillator or ring oscillator, is provided, for example for generating the system frequency when the MEMS oscillator is not active. In this case, the switching regulator is synchronized with the oscillator in the synchronous operating state.

According to a further embodiment of the electromechanical system of the present invention, the signal processing apparatus is designed to output an oscillation state signal to the voltage provision apparatus, the signal being dependent on the oscillating movement of the oscillation-capable component, wherein the voltage provision apparatus is designed to synchronize the switching regulator with the oscillating movement of the oscillation-capable component using the oscillation state signal.

According to a further embodiment of the electromechanical system of the present invention, the voltage provision apparatus is designed to regulate an integer frequency ratio and a fixed phase ratio in the synchronous operating mode in order to synchronize the switching regulator with the oscillating movement of the oscillation-capable component. In this way, in the synchronous mode the switching regulator oscillates at frequencies that are at a fixed ratio and in a fixed phase relative to the natural frequency of the oscillation-capable component.

According to a further embodiment of the electromechanical system of the present invention, the voltage provision apparatus is integrated into the signal processing apparatus. This results in a compact system.

According to a further embodiment of the electromechanical system, the MEMS apparatus comprises a rotation rate sensor and/or a micromirror as a oscillation-capable component.

In all figures, identical or functionally identical elements and devices are provided with the same reference signs. The numbering of the method steps is used for reasons of clarity and is generally not intended to imply any particular temporal order. It is in particular also possible to perform multiple method steps simultaneously.

DETAILED DESCRIPTION OF EXAMPLE EMBODIMENTS

Figure 1:
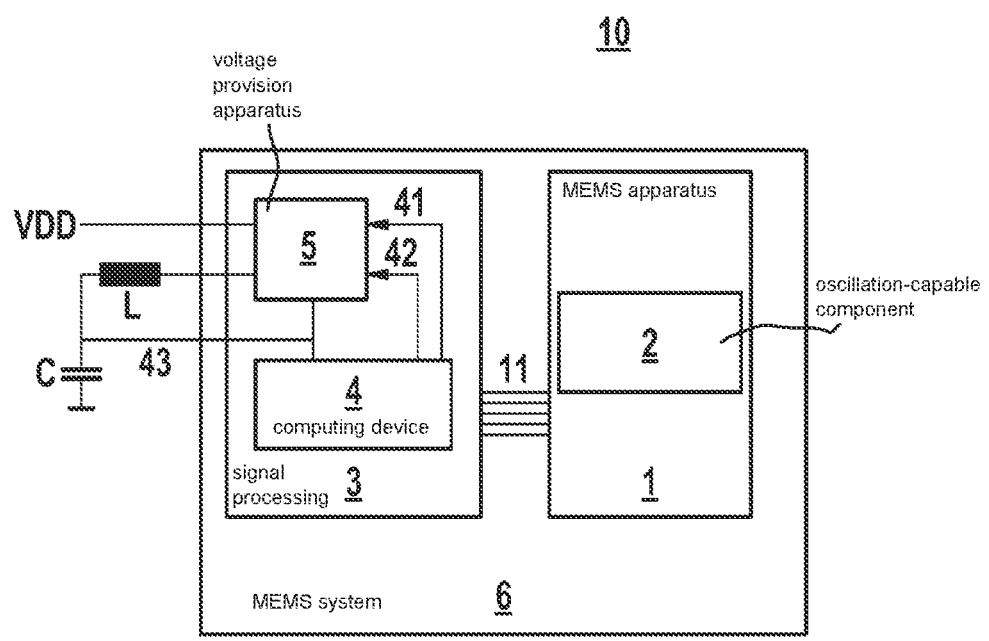
FIG. 1 shows a schematic block diagram of an electromechanical system according to a first example embodiment of the present invention.

FIG. 1 shows a schematic block diagram of an electromechanical system 10. The electromechanical system 10 comprises a microelectromechanical (MEMS) apparatus 1, which comprises a oscillation-capable component 2. The oscillation-capable component 2 may, for example, comprise a micromirror or an oscillating element of a rotation rate sensor. The electromechanical system 10 may also be a MEMS system, but may also be a macroscopic system, such as a bearable or wearable system or the like.

The MEMS apparatus 1 outputs a signal which is dependent on an oscillating movement of the oscillation-capable component 2. This may be a measurement signal which depends on the amplitude and/or frequency and/or phase of the oscillation-capable component 2.

The electromechanical system further comprises a signal processing apparatus 3 (application specific integrated circuit, ASIC) that receives the signal output by the MEMS apparatus 2 via an electrical connection 11 and processes the same. The signal processing apparatus 3 comprises a computing device 4, which monitors and regulates the oscillating movement or the temporal profile of the oscillating movement of the oscillation-capable element 2 using the measured signal. The signal processing apparatus 3 may output corresponding signals to the MEMS apparatus 2.

Further, the electromechanical system 10 comprises a voltage provision apparatus 5 designed to provide at least one supply voltage for the signal processing apparatus 3. The voltage provision apparatus 5 is supplied with a supply voltage VDD. FIG. 1 illustrates that at least a part of the voltage provision apparatus 5 is implemented as a component of the signal processing apparatus 3. According to the present invention, the voltage provision apparatus 5 comprises at least one switching regulator, which in the exemplary embodiment shown here also comprises external components, namely a coil L and a capacitor C, which are not part of the signal processing apparatus 3. These passive components, such as the coil L of capacitor C, may be integrated in a housing of the MEMS system 6. The switching regulator is designed to control the voltage 43 supplied to the computing device 4.

In the exemplary embodiment described here, the computing device 4 transmits two signals to the voltage provision apparatus: a first signal 41 having a reference frequency for synchronizing the switching regulator with the oscillating movement of the oscillation-capable component 2 as well as a second signal 42 for controlling the operating state. The first signal 41 depends on the oscillating movement of the oscillation-capable component 2, that is to say, it is an oscillation state signal.

Using the second signal 42, a switching is initiated between the synchronous operating state and the asynchronous operating state of the voltage provision apparatus 5.

The voltage provision apparatus 5 is operable in the synchronous operating state when the oscillation-capable component 2 is excited to oscillations or is in a steady oscillating state. The voltage provision apparatus 5 is operated as a switching regulator in the synchronous operating state, wherein in the synchronous operating state the switching regulator is synchronized with the oscillating movement of the oscillation-capable component 2. The synchronizing of the oscillation-capable component 2 and the switching regulator may be performed using first signal 41.

In the synchronous operating mode, the voltage provision apparatus 5 may regulate an integer frequency ratio and a fixed phase ratio for synchronizing the switching regulator with the oscillating movement of the oscillation-capable component 2. The switching regulator is thus operated at a frequency that stands at an integer frequency ratio and in a fixed phase ratio in relation to a natural frequency of the oscillation-capable component 2.

In the asynchronous operating state, the voltage provision apparatus 3 is not synchronized with the oscillation-capable component 2.

After starting the electromechanical system 10 in the asynchronous operating state, an automatic switching from the asynchronous operating state to the synchronous operating state may occur after a stable oscillation has been detected based on amplitude, phase, or other parameters.

Alternatively, after starting in the asynchronous operating state and after a predetermined time, switching from the asynchronous operating state to the synchronous operating state may be done automatically.

Further, if a reduction in oscillation has been detected using amplitude, phase or other parameters, switching back to the asynchronous operating state may be done.

The switching back to the asynchronous operating state can also occur in a configuration change of the electromechanical system 10, for example when switching off the oscillation-capable component 2.

In the embodiment shown in FIG. 1, the voltage provision apparatus 5 is integrated into the signal processing apparatus 3. Further, signal processing apparatus 3 and MEMS apparatus 1 are part of the MEMS system 6.

Figure 2:
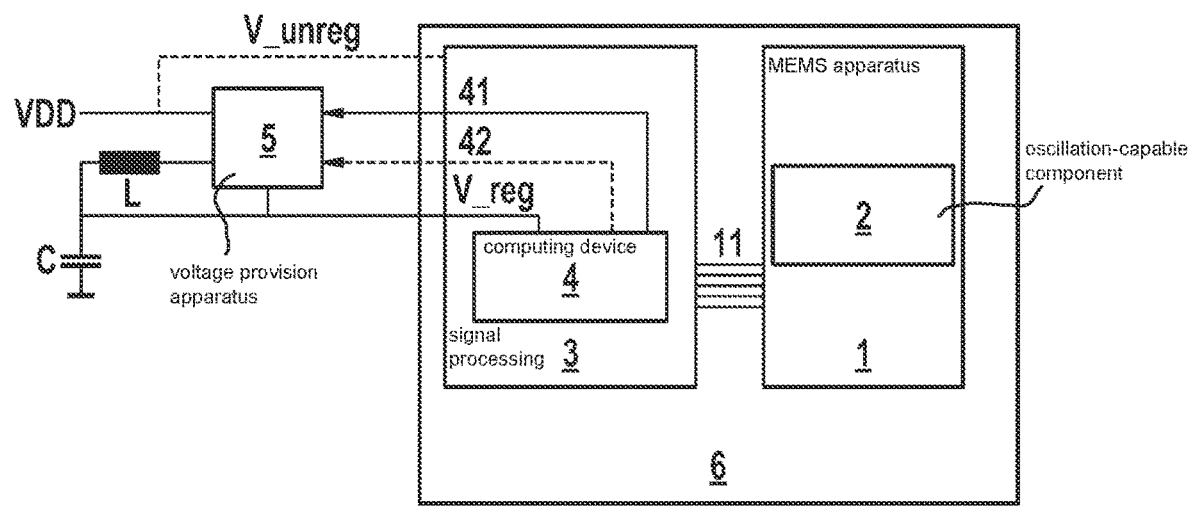
FIG. 2 shows a schematic block diagram of an electromechanical system according to a second example embodiment of the present invention.

FIG. 2 shows a schematic block diagram of an electromechanical system 20 with an external power supply VDD. Some components of the signal processing apparatus 3 use the external supply voltage VDD as such, which is indicated here via the dashed line connection VDD. Other components of the signal processing apparatus 3 require a lower supply voltage—as described above—which is referred to herein as V_reg. For this purpose, signal processing apparatus 3 could be equipped with a linear regulator as voltage regulator, the representation of which was omitted here for reasons of clarity. However, voltage regulation can also be carried out here with the aid of a voltage provision apparatus 5 according to the present invention having a switching regulator. However, in the embodiment shown, this is located—in contrast to the embodiment illustrated in FIG. 1—outside the MEMS system 6, i.e., on the host processor of a higher-level system. At one output of the MEMS system 6, the computing device 4 therefore provides the higher-level system with a first signal 41 which characterizes the oscillating movement of the oscillation-capable component 2. This signal 41 can be used to synchronize the switching regulator of the external voltage provision apparatus 5 according to the present invention and also to control the operating state of the switching regulator. However, optionally, the computing device 4 can also provide a second signal 42 for operating state control of the switching regulator, as indicated in FIG. 2 with dashed lines. Thus, if the higher-level system has a voltage provision apparatus 5 according to the present invention having a switching regulator, it can be used for voltage regulation for certain parts of the signal processing apparatus 3. Otherwise, voltage regulation may be carried out via the linear regulator of signal processing apparatus 3.

The second signal 42 is optional if the voltage provision apparatus 5 is designed such that the presence of a frequency in the signal 41 may be used as information for switching to synchronous mode.

Figure 3:
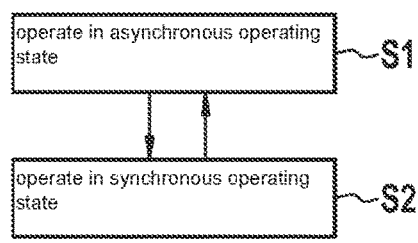
FIG. 3 shows a flowchart of a method for operating an electromechanical system according to an example embodiment of the present invention.

FIG. 3 shows a flow chart of a method for operating an electromechanical system, for example one of the electromechanical systems 10, 20 described above. The electromechanical system 10, 20 comprises a MEMS apparatus 1, which comprises an oscillation-capable component 2, wherein the MEMS apparatus 1 is designed to output a signal 11 which is dependent on an oscillating movement of the oscillation-capable component 2. The electromechanical system 10, 20 further comprises a signal processing apparatus 3 which is designed to receive and process the signal 11 output by the MEMS apparatus 1, and a voltage provision apparatus 5 which is designed to provide a supply voltage for the signal processing apparatus 3.

In a first method step S1, the voltage provision apparatus 5 may be operated in an asynchronous operating state, wherein in the asynchronous operating state the voltage provision apparatus 5 is not synchronized with the oscillation-capable component 2.

In a second method step S2, the voltage provision apparatus 5 is operated in a synchronous operating state when the oscillation-capable component 2 is excited to oscillations, wherein the voltage provision apparatus 5 is operated as a switching regulator in the synchronous operating state, and wherein in the synchronous operating state the switching regulator is synchronized with the oscillating movement of the oscillation-capable component 2.

The transition from the asynchronous operating state to the synchronous operating state may be done at a predetermined time after starting the electromechanical system 10, 20. The transition may also be made if it is detected that the oscillation-capable element 2 is in a steady oscillating state.

The transition from the synchronous operating state to the asynchronous operating state may occur when oscillation-capable element 2 is to be switched to inactive or if the asynchronous operating state is preferred due to application-related performance requirements for the MEMS system.

The invention claimed is:

1. An electromechanical system, comprising:
    a microelectromechanical (MEMS) apparatus which includes a component which can oscillate, wherein the MEMS apparatus is configured to output a signal which is dependent on an oscillating movement of the oscillation-capable component;
    a signal processing apparatus configured to receive and process the signal output by the MEMS apparatus; and
    a voltage provision apparatus configured to supply at least one supply voltage for the signal processing apparatus, the voltage provision apparatus including at least one switching regulator;
    wherein the voltage provision apparatus can be operated in a synchronous operating state and in an asynchronous operating state;
    wherein the voltage provision apparatus is operable in the synchronous operating state when the oscillation-capable component is excited to oscillations, wherein the voltage provision apparatus is operated as a switching regulator in the synchronous operating state, and wherein in the synchronous operating state the switching regulator is synchronized with the oscillating movement of the oscillation-capable component; and
    wherein, in the asynchronous operating state, the voltage provision apparatus is not synchronized with the oscillation-capable component.

2. The electromechanical system according to claim 1, wherein the signal processing apparatus is configured to ascertain that the oscillation-capable component is in a steady oscillating state, and is configured to switch the voltage provision apparatus to the synchronous operating state when the oscillation-capable component is in the steady oscillating state.

3. The electromechanical system according to claim 1, wherein the voltage provision apparatus is configured to switch from the asynchronous operating state to the synchronous operating state after an activation of the MEMS apparatus and/or to switch from the synchronous operating state to the asynchronous operating state before a deactivation of the MEMS apparatus.

4. The electromechanical system according to claim 1, wherein the voltage provision apparatus is configured to switch from the asynchronous operating state to the synchronous operating state after a predetermined time after the activation of the MEMS apparatus.

5. The electromechanical system according to claim 1, wherein the voltage provision apparatus operates as a switching regulator in the asynchronous operating state.

6. The electromechanical system according to claim 1, wherein the voltage provision apparatus operates as a linear regulator in the asynchronous operating state.

7. The electromechanical system according to claim 1, wherein the signal processing apparatus is configured to output a oscillation state signal to the voltage provision apparatus, the oscillation state signal being dependent on the oscillating movement of the oscillation-capable component, and wherein the voltage provision apparatus is configured to synchronize the switching regulator with the oscillating movement of the oscillation-capable component using the oscillation state signal.

8. The electromechanical system according to claim 1, wherein the voltage provision apparatus is configured to regulate an integer frequency ratio and a fixed phase ratio in the synchronous operation mode in order to synchronize the switching regulator with the oscillating movement of the oscillation-capable component.

9. The electromechanical system according to claim 1, wherein the voltage provision apparatus is integrated into the signal processing apparatus.

10. A method of operating an electromechanical system, the electromechanical system including a microelectromechanical (MEMS) device having a component which can oscillate, wherein the MEMS apparatus is configured to output a signal which is dependent on an oscillating movement of the oscillation-capable component, the electromechanical system further including a signal processing apparatus configured to receive and process the signal output by the MEMS apparatus, and a voltage provision apparatus configured to provide a supply voltage for the signal processing apparatus, wherein the voltage provision apparatus is operated alternatively in an asynchronous operating state or, when the oscillation-capable component is excited to oscillations, in a synchronous operating state, the method comprising:
  operating the voltage provision apparatus in the asynchronous operating state, wherein in the asynchronous operating state, the voltage provision apparatus is not synchronized with the oscillation-capable component; and
  operating the voltage provision apparatus as a switching regulator in the synchronous operating state, and wherein in the synchronous operating state, the switching regulator is synchronized with the oscillating movement of the oscillation-capable component.

\* \* \* \* \*